United States Patent
Tian et al.

(10) Patent No.: US 12,399,775 B2
(45) Date of Patent: Aug. 26, 2025

(54) DATA ENCODING METHOD, ELECTRONIC DEVICE, AND STORAGE MEDIUM

(71) Applicant: ZTE CORPORATION, Shenzhen (CN)

(72) Inventors: Chunyu Tian, Shenzhen (CN); Bing Han, Shenzhen (CN); Kunkun Yang, Shenzhen (CN); Cong Qin, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 18/572,500

(22) PCT Filed: May 23, 2022

(86) PCT No.: PCT/CN2022/094471
§ 371 (c)(1),
(2) Date: Dec. 20, 2023

(87) PCT Pub. No.: WO2022/267790
PCT Pub. Date: Dec. 29, 2022

(65) Prior Publication Data
US 2024/0289214 A1    Aug. 29, 2024

(30) Foreign Application Priority Data
Jun. 21, 2021   (CN) .......................... 202110686521.7

(51) Int. Cl.
*G06F 11/10*   (2006.01)
(52) U.S. Cl.
CPC ...... *G06F 11/1064* (2013.01); *G06F 11/1004* (2013.01)

(58) Field of Classification Search
None
See application file for complete search history.

(56) References Cited

U.S. PATENT DOCUMENTS 11,138,065 B1 * 10/2021 Zamir .................. G06F 3/0658
2009/0217122 A1   8/2009 Yokokawa et al.
2016/0124858 A1   5/2016 Koka et al.
2019/0340068 A1  11/2019 Bhatia et al.
2020/0004628 A1 *  1/2020 Ben-Rubi .......... H03M 13/1111
(Continued)

FOREIGN PATENT DOCUMENTS

CN     102394661 A     3/2012
CN     106936446 A     7/2017
(Continued)

OTHER PUBLICATIONS

European Patent Office. Extended European Search Report for EP Application No. 22827287.8, mailed Sep. 30, 2024, pp. 1-8.
(Continued)

*Primary Examiner* — Daniel F. McMahon
(74) *Attorney, Agent, or Firm* — Vivacqua Crane, PLLC

(57) ABSTRACT

A data encoding method includes, writing information bits into at least two cache blocks, where the cache blocks store parity bits corresponding to the information bits, and two adjacent bits of data of the parity bits are stored in different cache blocks; and performing low density parity check code (LDPC) encoding according to the information bits and the parity bits in the cache blocks.

20 Claims, 6 Drawing Sheets

Write information bits into at least two cache blocks, where the cache blocks store parity bits corresponding to the information bits, and two adjacent bits of data of the parity bits are stored in different cache blocks — S110

Perform LDPC encoding according to the information bits and the parity bits in the cache blocks — S120

(56) References Cited

U.S. PATENT DOCUMENTS

2020/0272539 A1* 8/2020 Varanasi ................ G11C 29/52
2020/0373944 A1* 11/2020 Cho .................... G06F 11/1048

FOREIGN PATENT DOCUMENTS

| CN | 109347486 A | 2/2019 |
| CN | 111313912 A | 6/2020 |
| CN | 112764673 A | 5/2021 |
| JP | 2006304132 A | 11/2006 |

OTHER PUBLICATIONS

Korean Intellectual Property Office. First Office Action for KR Application No. 10-2024-7001422 and English translation, mailed Nov. 4, 2024, pp. 1-6.

International Searching Authority. International Search Report and Written Opinion for PCT Application No. PCT/CN2022/094471 and English translation, mailed Aug. 11, 2022, pp. 1-10.

Japan Patent Office. Notice of Reasons for Refusal for JP Application No. 2023-577809 and English translation, mailed Nov. 28, 2024, pp. 1-8.

Yokokawa, T., et al. "A Low Complexity and Programmable Encoder Architecture of the LDPC Codes for DVB-S2," IEEE Turbo-Coding, 2006, pp. 1-7.

\* cited by examiner

DATA ENCODING METHOD, ELECTRONIC DEVICE, AND STORAGE MEDIUM

CROSS-REFERENCE TO RELATED APPLICATION

This application is a national stage filing under 35 U.S.C. § 371 of international application number PCT/CN2022/094471, filed May 23, 2022, which claims priority to Chinese patent application No. 202110686521.7 filed Jun. 21, 2021. The contents of these applications are incorporated herein by reference in their entirety.

TECHNICAL FIELD

The present disclosure relates to but is not limited to the field of communications technologies, and in particular to a data encoding method, an electronic device, and a storage medium.

BACKGROUND

A satellite communication system consists of a satellite, a hub system, an end station system, and an Application (APP) system. The hub system and the end station system located on the earth use the satellite as a relay station to realize signal forwarding. A transmission link from the hub system to the satellite and then to the end station system is called a forward link. To improve the signal transmission quality of the satellite communication system and enhance an anti-interference ability of a channel, the Digital Video Broadcasting (DVB)-S2 protocol stipulates that a coding mode of the forward link is low density parity check code (LDPC), in which information bits are divided into multiple data blocks, and then updating iterative calculation and an exclusive or (XOR) operation are performed on the parity bits successively using the preset parity bit.

DVB-LDPC coding is usually executed by a field programmable gate array (FPGA). In a common implementation scheme, one bit of parity bit is put in each column of a random access memory (RAM), to realize parallel computing of update and iteration through serial-by-column parity bits. This improves the efficiency of update and iteration. However, XOR operation requires the serial mode to obtain data, while FPGA can only obtain data of one address at a time in one and the same cache. Consequently, XOR operation can only be performed by bits, which has low coding efficiency, and affects an interaction rate of the satellite communication system.

SUMMARY

The following is a summary of the subject matters described in detail herein. This summary is not intended to limit the scope of protection of the claims.

Embodiments of the present disclosure provide a data encoding method, an electronic device, and a storage medium, to improve the efficiency of an XOR operation, and thus improve an interaction rate of a satellite communication system.

In accordance with a first aspect of the present disclosure, an embodiment provides a data encoding method. The method may include: writing information bits into at least two cache blocks, where the cache blocks store parity bits corresponding to the information bits, and two adjacent bits of data of the parity bits are stored in different cache blocks; and performing LDPC encoding according to the information bits and the parity bits in the cache blocks.

In accordance with a second aspect of the present disclosure, an embodiment further provides an electronic device. The device may include: a memory, a processor, and a computer program stored in the memory and executable by the processor, where the computer program, when executed by the processor, causes the processor to implement the data encoding method of the first aspect.

Additional features and advantages of the embodiments of the present disclosure will be set forth in the subsequent description, and in part will become apparent from the description, or may be learned by practice of the embodiments of the present disclosure. The purposes and other advantages of the present disclosure can be realized and obtained by structures particularly noted in the description, the claims and the accompanying drawings.

BRIEF DESCRIPTION OF DRAWINGS

The accompanying drawings are used to provide further understanding of the technical schemes of the present disclosure and constitute a part of the description. The accompanying drawings are used to explain the technical schemes of the present disclosure together with the embodiments of the present disclosure, and do not constitute a restriction on the technical schemes of the present disclosure.

DETAILED DESCRIPTION

In order to make the objectives, technical schemes and advantages of the present disclosure more apparent, the present disclosure is further described in detail in conjunction with the accompanying drawings and embodiments. It should be understood that the particular embodiments described herein are only intended to explain the present disclosure, and are not intended to limit the present disclosure.

It is to be noted that although a functional module division is shown in a schematic diagram of a device and a logical order is shown in a flowchart, the steps shown or described may be executed, in some cases, in a different module division from that of the device or in a different order from that in the flowchart. The terms such as "first" and "second" in the description, claims or above-mentioned drawings are intended to distinguish between similar objects and are not necessarily to describe a specific order or sequence.

Embodiments of the present disclosure provide a data encoding method, an electronic device, and a storage medium, the data encoding method including: writing information bits into at least two cache blocks, where the cache blocks store parity bits corresponding to the information bits, and two adjacent bits of data of the parity bits are stored in different cache blocks; and performing LDPC encoding according to the information bits and the parity bits in the cache blocks. According to the scheme provided by the embodiment of the present disclosure, since the parity bits are stored in different cache blocks, after updating iterative calculation of the parity bits is completed, an FPGA can read the parity bits from the plurality of cache blocks in a parallel manner, thereby reading the parity bits faster, and effectively improving the coding efficiency and an interaction rate of a satellite communication system.

The embodiments of the present disclosure will be further explained below with reference to the accompanying drawings.

Figure 1:
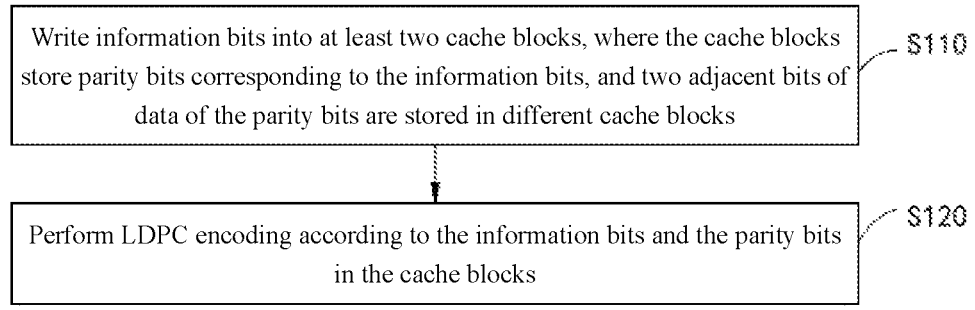
FIG. 1 is a flowchart of a data encoding method according to an embodiment of the present disclosure.

FIG. 1 is a data encoding method provided by an embodiment of the present disclosure. The method includes but is not limited to the following steps.

At S110, information bits are written into at least two cache blocks, where the cache blocks store parity bits corresponding to the information bits, and two adjacent bits of data of the parity bits are stored in different cache blocks.

It should be noted that the information bits may come from a transmission block. After obtaining the transmission block, its available cache space may be determined first. When there is enough space for storing the transmission block, a subsequent step is performed, avoiding encoding failure caused by insufficient space.

It should be noted that because an FPGA can only read one address from a cache at a time, in order to realize parallel reading of parity bits, at least two cache blocks can be used to store parity bits, which are written into the cache blocks by bits according to an arrangement order, so that the FPGA needs to read the parity bits from the plurality of caches. This realizes parallel reading of the parity bits and improves the efficiency of LDPC encoding.

At S120, LDPC encoding is performed according to the information bits and the parity bits in the cache blocks.

It should be noted that because the parity bits are distributed in different cache blocks, the parity bits can be read in a parallel manner during an XOR operation, which effectively improves the data acquisition efficiency of the XOR operation compared with a serial bit-by-bit reading mode, and thus improves an interaction rate of a satellite communication system.

Further, in an embodiment, the at least two cache blocks belong to one and the same RAM.

Figure 2:
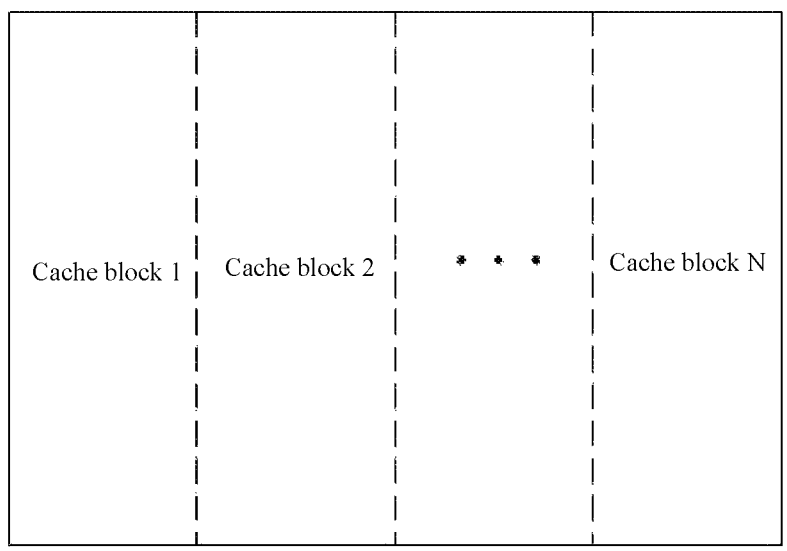
FIG. 2 is a structural diagram of a RAM according to another embodiment of the present disclosure.

It should be noted that RAMs can be spliced so that at least two cache blocks are provided in the FPGA, as shown in a schematic diagram of a RAM structure in FIG. 2. The RAM is obtained by splicing N cache blocks in turn, cache block 1 is spliced with cache block 2, cache block 2 is spliced with cache block 3, and so on.

It is worth noting that, for FPGA, a size of RAM is usually fixed, such as common 18 K and 36 K. Taking 18 K as an example, RAM usually has 1024 lines, each of which can store 18-bit data. To improve the utilization of resources, a bit width of the cache block is set to 18 bits. By splicing 20 cache blocks, 360-bit data can be stored. Then, parity bit caches are distributed in the cache blocks. Certainly, a bit width less than 18 bits can also be selected for the configuration of the cache block. Those having ordinary skill in the art have motivation to adjust a specific value of a bit width according to an actual situation, which is not limited herein.

Figure 3:
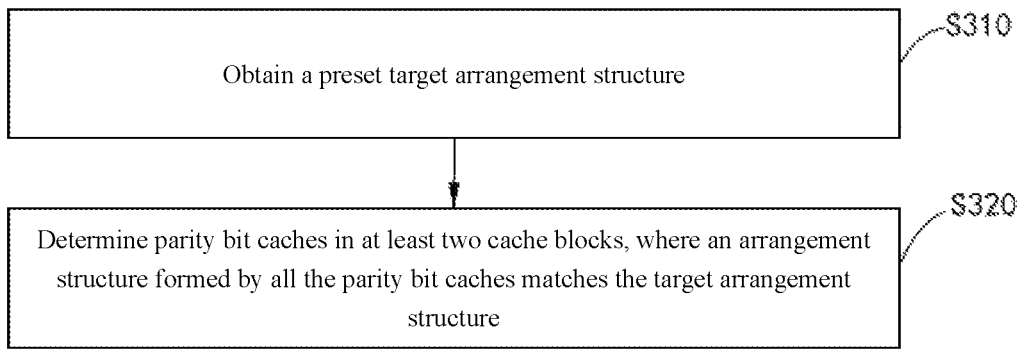
FIG. 3 is a flowchart of determining a cache block according to another embodiment of the present disclosure.

Further, referring to FIG. 3, in an embodiment, prior to performing S110 in the embodiment shown in FIG. 1, the method further includes but is not limited to the following steps.

At S310, a preset target arrangement structure is obtained.

At S320, parity bit caches are determined in the at least two cache blocks, where an arrangement structure formed by all the parity bit caches matches the target arrangement structure.

Figure 9:
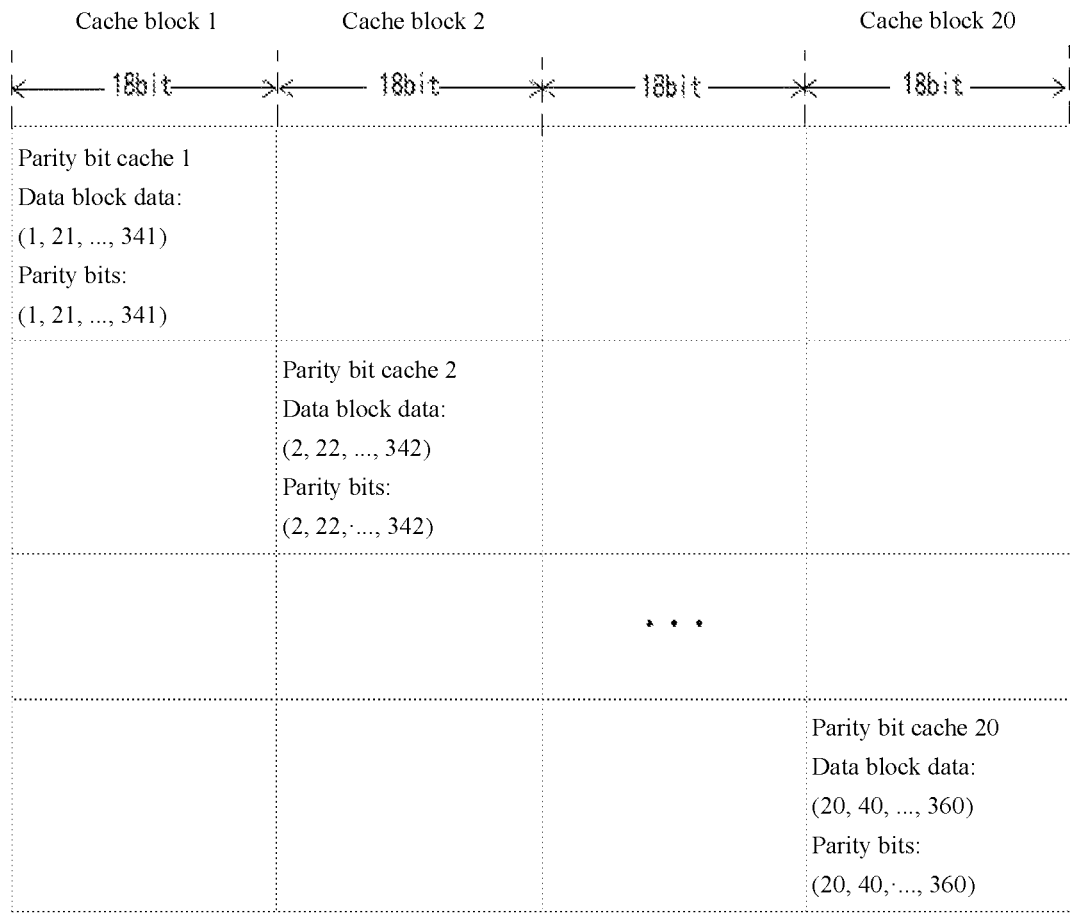
FIG. 9 is a flowchart of clearing a cache block according to another embodiment of the present disclosure.

It should be noted that the arrangement structure of the parity bit caches may be formulated according to an actual requirement. For example, when a RAM structure shown in FIG. 9 is used, considering that parity bits and information bits need to be written in sequence, a spiral structure can be used as the target arrangement structure, that is, the parity bit caches are offset row by row. In the case of using 18 bits as the bit width, the first 18 bits of the first row of the first cache block are determined as parity bit cache 1, the 19th-36th bits of the second row of the second cache block are determined as parity bit cache 2, and so on, thus realizing a spiral structure with a row-by-row offset and making full use of cache resources. Certainly, those having ordinary skill in the art have the motivation to adjust the arrangement according to an actual memory condition, provided that the parity bit caches are located in different cache blocks.

It should be noted that an offset between the parity bits stored in the parity bit caches obtained by the above manner is determined by the target arrangement structure. For example, if the size of the RAM space used for LDPC encoding is 360 bits, a value range of the offset can be any value between 1 and 359. Referring to FIG. 9, when the spiral structure shown in FIG. 9 is used, an offset of two adjacent parity bits is the same as the bit width, which is 18 bits. The specific offset can be adjusted according to the bit width and arrangement of the parity bit caches. A specific value is not limited herein.

It is worth noting that there is no strict correspondence between the offset and the bit width of the cache block, and the offset can also be set to a value different from the bit width, provided that each parity bit can be directly stored into a corresponding cache block.

Figure 4:
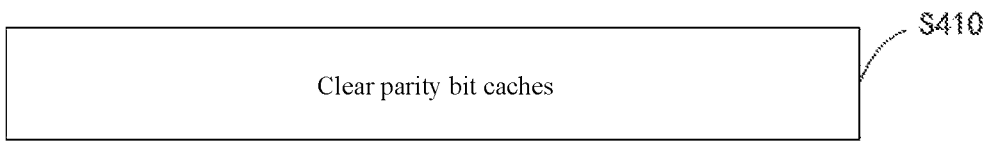
FIG. 4 is a flowchart of data block segmentation according to another embodiment of the present disclosure.

Further, referring to FIG. 4, in an embodiment, after the execution of S320 in the embodiment shown in FIG. 3, the method further includes but is not limited to the following step.

At S410, the parity bit caches are cleared.

It should be noted that after the parity bit caches are determined, initial parity bits can be obtained by clearing the parity bit caches. An initial value of each bit of the initial parity bits is zero.

It is worth noting that a position at which the clearing operation is performed is a position corresponding to the transmission block, that is, a position used for storing the parity bits. Since the parity bit cache has a bit width, if there are some spaces that do not involve the current LDPC encoding, the clearing operation may not be performed on the spaces, which is not limited in this embodiment.

Figure 5:
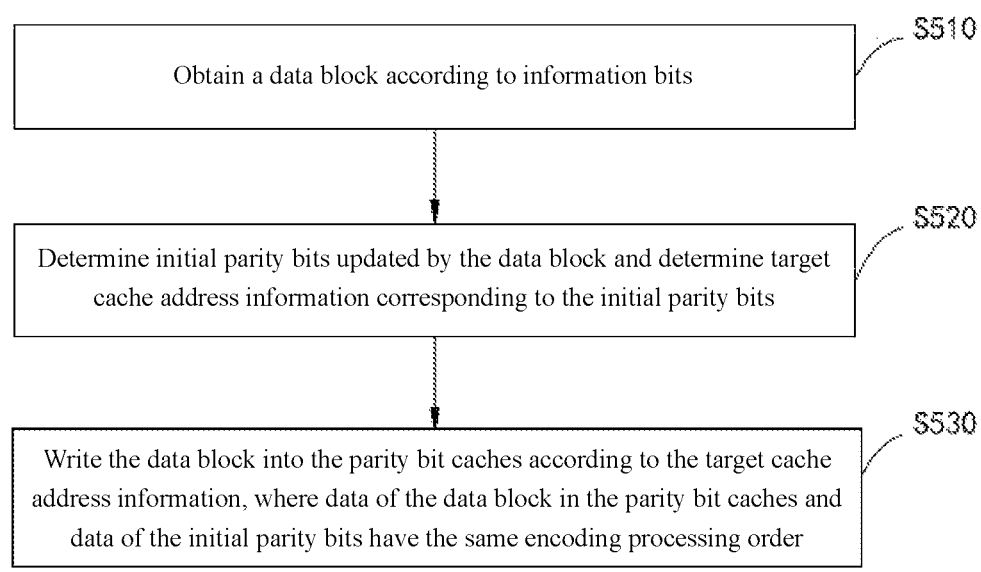
FIG. 5 is a flowchart of a target arrangement structure according to another embodiment of the present disclosure.

Further, referring to FIG. 5, in an embodiment, S110 in the embodiment shown in FIG. 1 further includes but is not limited to the following steps.

At S510, a data block is obtained according to the information bits.

At S520, initial parity bits updated by the data block are determined and target cache address information corresponding to the initial parity bits is determined.

At S530, the data block is written into the parity bit caches according to the target cache address information, where data of the data block in the parity bit caches and data of the initial parity bits have the same encoding processing order.

It should be noted that, for satellite communication, a relevant protocol specifies a size of the information bits, for example, 64800 bits. Therefore, to make full use of RAM storage resources, the size of the data block can be predetermined, for example, the information bits may be divided into a plurality of 360-bit data blocks according to the predetermined size. Certainly, the size of the data block can also be adjusted according to actual cache resources and a requirement of simplified computation, which will not be described in detail in this embodiment.

It should be noted for a manner of obtaining the initial parity bits, refer to the method described in the embodiment in FIG. 4, and will not be repeated herein for ease of description.

It can be understood that a cache address of each of the initial parity bits should also be determined after the initial parity bits are determined, so that after the initial parity bits being determined, the corresponding cache addresses may be stored, for example, in a read-only memory (ROM). In addition, a correspondence between the information bits and the parity bits should be determined before encoding, so that the initial parity bits to be updated through the data block can be determined before the data block is written. Target cache address information corresponding to the initial parity bits can be read from the ROM. After the data block is written into the cache block, a position of each piece of data in the data block is adjusted according to the target cache address information to match the spiral structure of the parity bits, so that each of the parity bit caches store data block data and initial parity bits with the same encoding processing order.

It should be noted that after dividing the data block, each bit of data can be stored in one parity bit cache. For example, as shown in FIG. 9, there are 20 cache blocks, each of which has an 18-bit bit width. The parity bit caches are distributed in the cache blocks according to a spiral structure. After obtaining the data block, 1 bit of data block data is stored in parity bit cache 1, and 1 bit data of data block data is stored in parity bit cache 2. The data block has 360 bits, the bit width of the parity bit cache is 18, and one piece of data block data only occupies one bit. Therefore, the 21st piece of data block data can be stored in the second bit of the parity bit cache 1, the 22nd piece of data block data can be stored in the second bit of the parity bit cache 2, and so on, until all the data block data of 360 bits is stored in the parity bit caches. The parity bits can be placed in a similar way to data block data, which is not repeated herein.

It is worth noting that, by storing data according to the spiral structure shown in FIG. 9, the data in the parity bit caches can be read in parallel. For example, a processor can realize 18-bit degree of parallelism, to be specific, the processor obtains the first to 18th bits of the parity bits from the parity bit caches 1 to 18 for the first time, and obtains the 19th to 36th bits of the parity bits from the parity bit caches 19 to 20 and the parity bit caches 1 to 16 for the second time, and so on, thereby realizing parallel reading of the parity bits, improving the efficiency of data reading, and thus improving the efficiency of LDPC encoding.

Figure 6:
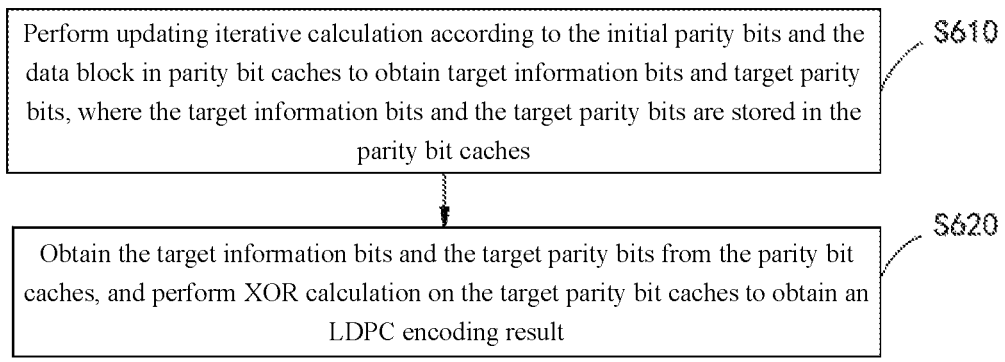
FIG. 6 is a flowchart of LDPC encoding according to another embodiment of the present disclosure.

Further, referring to FIG. 6, in an embodiment, S120 in the embodiment shown in FIG. 1 further includes but is not limited to the following steps.

At S610, updating iterative calculation is performed according to the initial parity bits and the data block in the parity bit caches to obtain target information bits and target parity bits, where the target information bits and the target parity bits are stored in the parity bit caches.

At S620, the target information bits and the target parity bits are obtained from the parity bit caches, and XOR calculation is performed on the target parity bit caches to obtain an LDPC encoding result.

It should be noted that when the initial parity bits and data of the data block are stored in the parity bit caches, the initial parity bits can be read from the caches by an FPGA according to the obtained target cache address information, and the updating iterative calculation is performed on the initial parity bits and the data block with an adjusted structure. A specific updating iterative calculation method is not an improvement made by this embodiment. Those having ordinary skill in the art are familiar with a subsequent operation after obtaining the data, which will not be described herein.

It can be understood that after the updating iterative calculation is completed, the data in the parity bit caches are the target information bits and the target parity bits. Due to the arrangement structure of the parity bit caches, the target parity bits are stored in different cache blocks. Therefore, the target parity bits can be read in a parallel manner, thereby improving the efficiency of LDPC encoding.

It is worth noting that common serial reading method can be used for reading the target information bits, which is not described in detail in this embodiment.

It should be noted that the XOR calculation of the target parity bits is performed for two adjacent bits. For example, in the structure shown in FIG. 9, the XOR result of parity bit 1 is itself, XOR calculation of parity bit 2 is performed with the parity bit 1, and so on. After the parallel acquisition of the target parity bits is realized through the technical scheme of this embodiment, those having ordinary skill in the art are familiar with how to complete the XOR calculation and obtain an LDPC encoding result according to the target parity bits and the target information bits after the XOR calculation, which will not be described herein.

Figure 7:
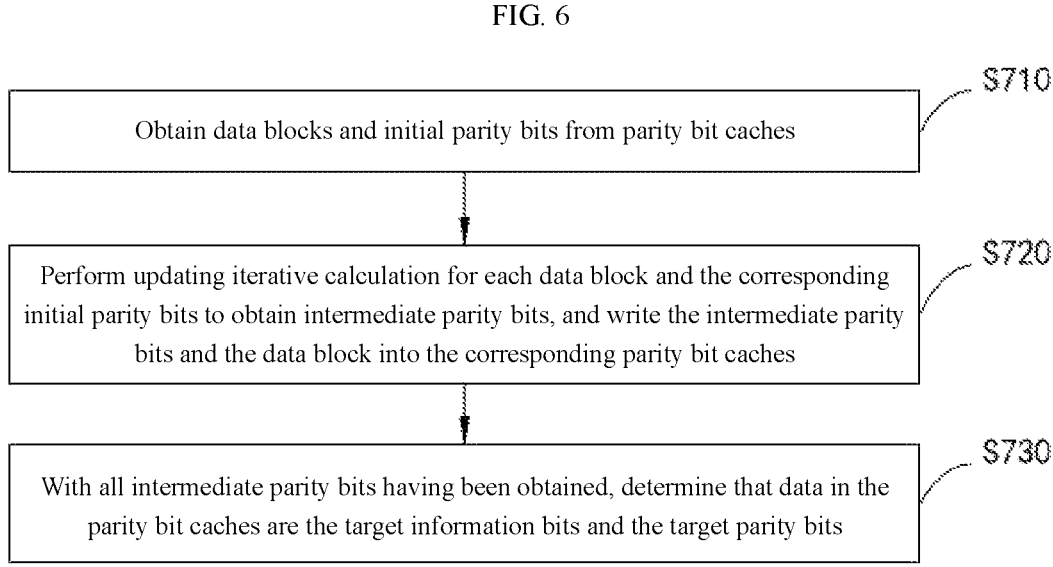
FIG. 7 is a flowchart of multi-data block processing according to another embodiment of the present disclosure.

Further, referring to FIG. 7, in an embodiment, the number of data blocks is at least two. S610 in the embodiment shown in FIG. 6 further includes but is not limited to the following steps.

At S710, the data blocks and the initial parity bits are obtained from the parity bit caches.

At S720, updating iterative calculation is performed for each data block and the corresponding initial parity bits to obtain intermediate parity bits, and the intermediate parity bits and the data block are written into the corresponding parity bit caches.

At S730, with all intermediate parity bits having been obtained, it is determined that data in the parity bit caches are the target information bits and the target parity bits.

It should be noted that after the initial parity bits are updated for the first time and the intermediate parity bits are obtained through the updating iterative calculation in step S720, since the information bits are divided into a plurality of data blocks, it is necessary to ensure that each data block completes the calculation in the step. Therefore, the intermediate parity bit can be written into the corresponding parity bit cache after it is obtained, and the next data block can be written into the parity bit using the same method as described in the above embodiment. Further, the updating iterative calculation recorded in step S720 is executed. When calculation of all the data blocks is completed, it can be determined that calculation of the parity bits is completed and obtained parity bits are determined as the target parity bits.

Figure 8:
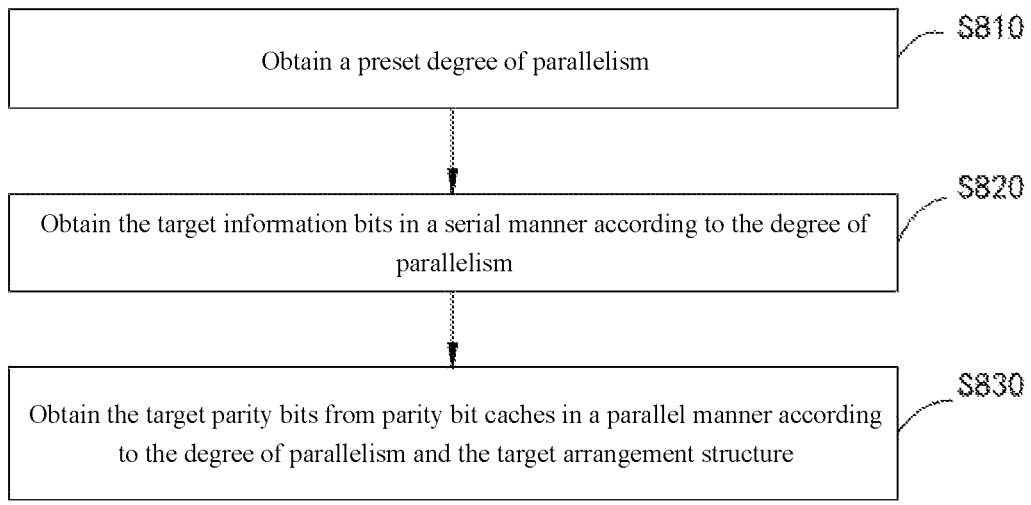
FIG. 8 is a flowchart of determining a cache block according to another embodiment of the present disclosure.

Further, referring to FIG. 8, in an embodiment, S620 in the embodiment shown in FIG. 6 further includes but is not limited to the following steps.

At S810, a preset degree of parallelism is obtained.

At S820, the target information bits are obtained in a serial manner according to the degree of parallelism.

At S830, the target parity bits are obtained from the parity bit caches in a parallel manner according to the degree of parallelism and the target arrangement structure.

It should be noted that the degree of parallelism can be adjusted according to an actual processing capability, and this embodiment does not limit a specific value of the degree of parallelism. For example, in the case of reading data with an 18-bit degree of parallelism, the first bit of data is read from the first cache address of the first 18 cache blocks for the first time, the first bit of data is read from the first cache address of the 19th to 20th cache blocks for the second time, and the second bit of data is read from the second bit address of the 1st to 16th cache blocks. As the above operations do not involve reading multiple addresses from one cache, the FPGA can implement the operations. This effectively improves the efficiency of data reading.

It should be noted that obtaining the target information bits in a serial manner according to a preset degree of parallelism is a technology well-known for those having ordinary skill in the art, and will not be described in details herein.

It should be noted that referring to the arrangement of the spiral structure shown in FIG. 9, data block data and check code of all bits are located in different rows and columns, and two adjacent bits are located in different cache blocks. The FPGA can read data in different cache blocks at the same time. When the target arrangement structure is determined, an address of the parity bit cache is known. Therefore, through the parity bit cache and the arrangement structure of parity bits in this embodiment, the parity bits can be read in parallel.

To better explain the technical scheme of the embodiment of the present disclosure, an example is given below.

In this example, as shown in FIG. 9, a structure of a RAM is composed of 20 cache blocks with a bit width of 18 bits. For simplicity, an offset value of 18 bits is taken as an example, and the arrangement structure of the parity bit caches uses a spiral structure.

Figure 10:
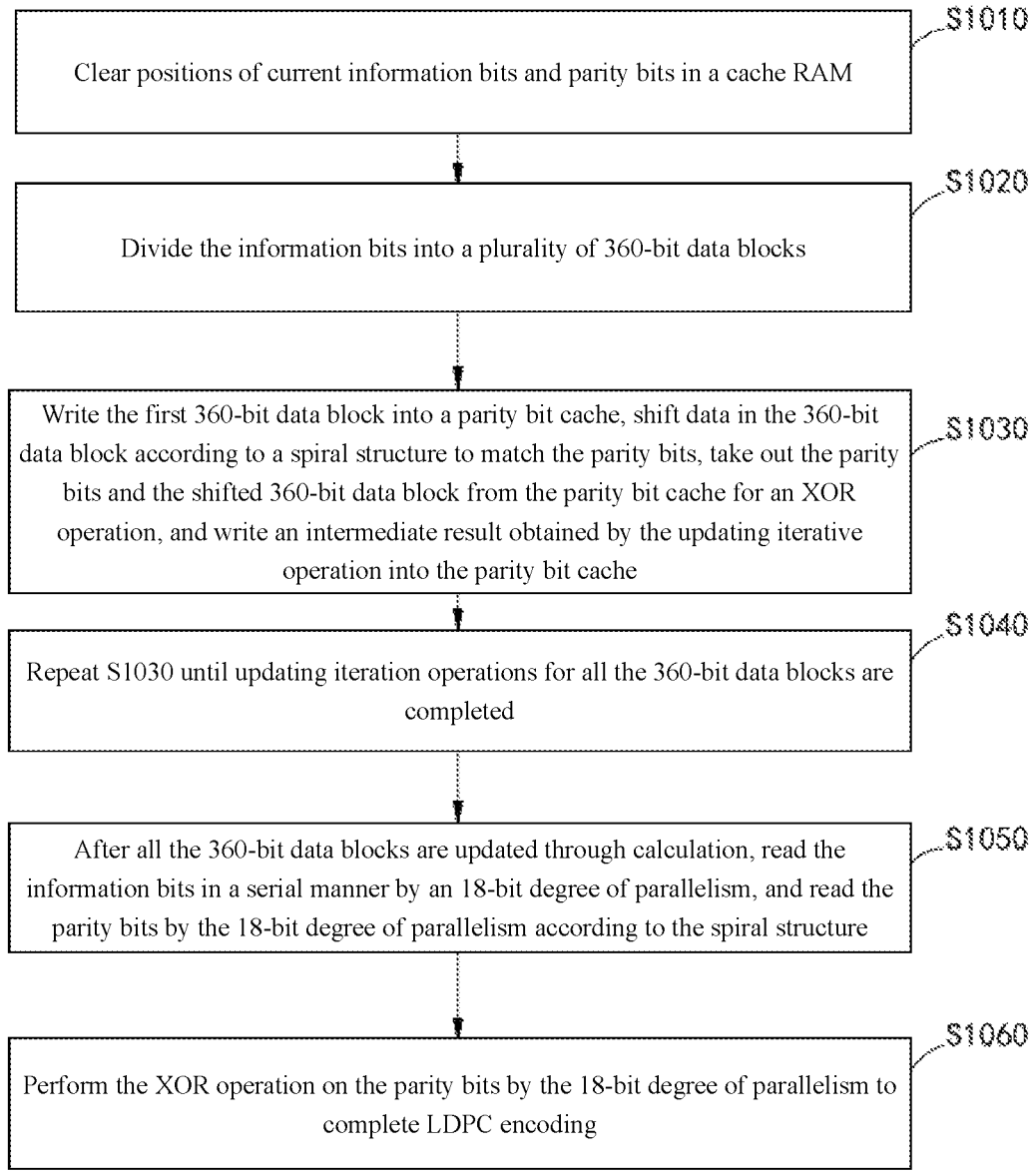
FIG. 10 is a flowchart of a data encoding method according to an example of the present disclosure.

As shown in FIG. 10, the data encoding method of the present example includes but is not limited to the following steps.

At S1010, positions of current information bits and parity bits in the cache RAM are cleared.

At S1020, the information bits are divided into a plurality of 360-bit data blocks.

At S1030, the first 360-bit data block is written into the parity bit cache, data in the 360-bit data block are shifted according to the spiral structure to match the parity bits, the parity bits and the shifted 360-bit data block are taken out from the parity bit cache for an XOR operation, and an intermediate result obtained by the updating iterative operation is written into the parity bit cache.

At S1040, S1030 is repeated until updating iteration operations for all the 360-bit data blocks are completed.

At S1050, after all the 360-bit data blocks are updated through calculation, the information bits are read in a serial manner by an 18-bit degree of parallelism, and the parity bits are read by the 18-bit degree of parallelism according to the spiral structure.

At S1060, the XOR operation is performed on the parity bits by the 18-bit degree of parallelism to complete LDPC encoding.

Figure 11:
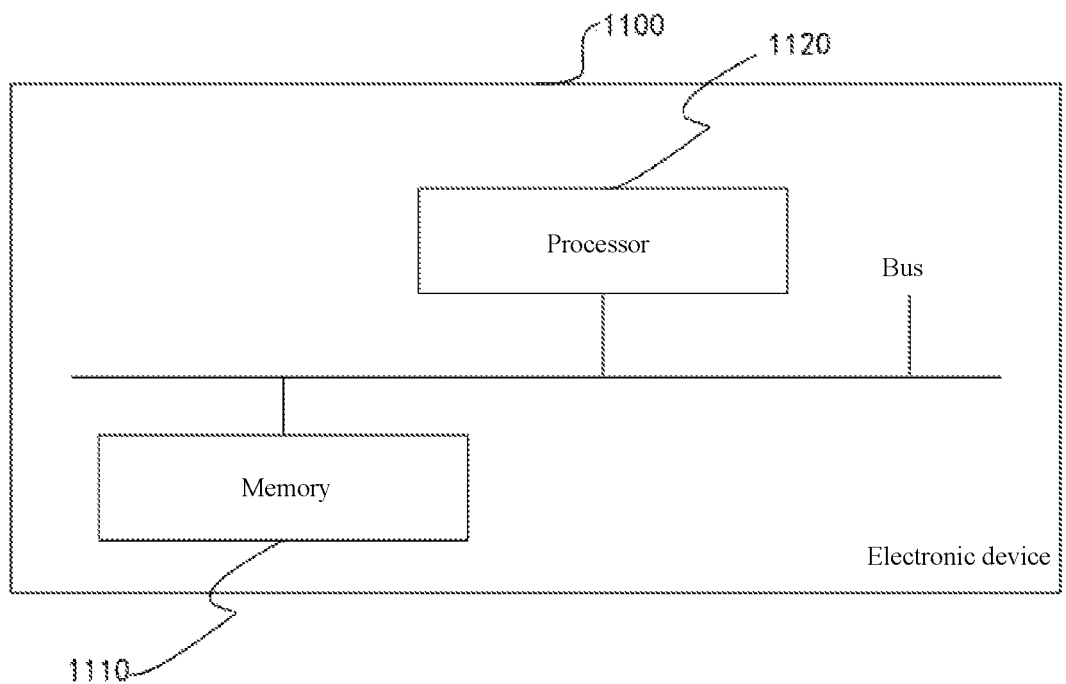
FIG. 11 is a structural diagram of an electronic device according to another embodiment of the present disclosure.

Further, referring to FIG. 11, an embodiment of the present disclosure also provides an electronic device 1100, including: a memory 1110, a processor 1120, and a computer program stored in the memory 1110 and executable by the processor 1120.

The processor 1120 and the memory 1110 may be connected by a bus or by other means.

Non-transient software programs and instructions required to implement the data encoding method in any of the above embodiments are stored in the memory 1110, and when executed by the processor 1120, cause the processor to perform the data encoding method in any of the above embodiments, for example, to perform the above-described method steps S110 to S120 in FIGS. 1, S310 to S320 in FIG. 3, S410 in FIGS. 4, S510 to S530 in FIGS. 5, S610 to S620 in FIGS. 6, S710 to S730 in FIG. 7, or S810 to S830 in FIG. 8.

The apparatus embodiments described above are only for illustration. The units described as separate components may or may not be physically separated, that is, they may be located at one place or distributed to multiple network units. Some or all of the modules can be selected according to actual needs to achieve the purpose of the embodiment.

Furthermore, an embodiment of the present disclosure also provides a computer-readable storage medium storing computer-executable instructions which, when executed by a processor or controller, for example, the processor in any of the above-mentioned embodiments of the electronic device, can cause the processor to perform the data encoding method in any of the above embodiments, for example, to perform the above-described method steps S110 to S120 in FIGS. 1, S310 to S320 in FIG. 3, S410 in FIGS. 4, S510 to S530 in FIGS. 5, S610 to S620 in FIGS. 6, S710 to S730 in FIG. 7, or S810 to S830 in FIG. 8.

An embodiment of the present disclosure includes: writing information bits into at least two cache blocks, where the cache blocks store parity bits corresponding to the information bits, and two adjacent bits of data of the parity bits are stored in different cache blocks; and performing LDPC encoding according to the information bits and the parity bits in the cache blocks. According to the scheme provided by the embodiment of the present disclosure, since the parity bits are stored in different cache blocks, after updating iterative calculation of the parity bits is completed, an FPGA can read the parity bits from the plurality of cache blocks in a parallel manner, thereby reading the parity bits faster, and effectively improving the coding efficiency and an interaction rate of a satellite communication system.

It can be understood by those of ordinary skill in the art that all or some of the steps of the methods and systems disclosed above may be implemented as software, firmware, hardware, and appropriate combinations thereof. Some or all of the physical components may be implemented as software executed by a processor, such as a central processing unit, a digital signal processor or a microprocessor, or as hardware, or as an integrated circuit, such as an application-specific integrated circuit. Such software may be distributed on computer-readable media, which may include computer-readable storage media (or non-transitory media) and communication media (or transitory media). As well known to those of ordinary skill in the art, the term computer-readable storage medium includes volatile and nonvolatile, removable and non-removable media implemented in any method or technique for storing information, such as computer-readable instructions, data structures, program modules or other data. A computer storage medium includes but is not limited to RAM, ROM, EEPROM, flash memory or other memory technologies, CD-ROM, digital versatile disk (DVD) or other optical disk storage, cassettes, magnetic tapes, magnetic disk storage or other magnetic storage devices, or any other medium that can be configured to store desired information and can be accessed by a computer. Furthermore, it is well known to those of ordinary skill in the art that communication media typically contain computer-readable instructions, data structures, program modules or other data in a modulated data signal such as a carrier wave or other transmission mechanism, and may include any information transmission media.

The above is a detailed description of some implementations of the present disclosure, but the present disclosure is not limited to the above-mentioned embodiments. Those of ordinary skill in the art can also make various equivalent modifications or replacements without departing from the principle of the present disclosure, and these equivalent modifications or replacements are all included in the scope defined by the claims of the present disclosure.

What is claimed is:

1. A data encoding method, comprising:
   writing information bits into at least two cache blocks, wherein the cache blocks store parity bits corresponding to the information bits, and data of two adjacent bits of data of the parity bits are stored in different cache blocks; and
   performing low density parity check code (LDPC) encoding according to the information bits and the parity bits in the cache blocks.

2. The method of claim 1, wherein the at least two cache blocks belong to a same random access memory (RAM).

3. The method of claim 1, before writing information bits into at least two cache blocks, further comprising:
   obtaining a preset target arrangement structure; and
   determining parity bit caches in the at least two cache blocks, wherein an arrangement structure formed by all the parity bit caches matches the target arrangement structure.

4. The method of claim 3, after determining parity bit caches in the at least two cache blocks, further comprising:
   clearing the parity bit caches.

5. The method of claim 3, wherein the writing information bits into at least two cache blocks comprises:
   obtaining a data block from the information bits;
   determining initial parity bits to be updated based on the data block and determining target cache address information corresponding to the initial parity bits; and
   writing the data block into the parity bit caches according to the target cache address information, wherein data of the data block in the parity bit caches and data of the initial parity bits have a same encoding processing order.

6. The method of claim 5, wherein the performing LDPC encoding according to the information bits and the parity bits in the cache blocks comprises:
   performing updating iterative calculation according to for the initial parity bits and the data block in the parity bit caches to obtain target information bits and target parity bits, wherein the target information bits and the target parity bits are stored in the parity bit caches; and
   obtaining the target information bits and the target parity bits from the parity bit caches, and performing exclusive or (XOR) calculation on the target parity bits to obtain an LDPC encoding result.

7. The method of claim 6, wherein the number of the data blocks is at least two, and the performing updating iterative calculation for the initial parity bits and the data block in the parity bit caches comprises:
   obtaining the data blocks and the initial parity bits from the parity bit caches;
   performing updating iterative calculation for each data block and the corresponding initial parity bits to obtain intermediate parity bits, and writing the intermediate parity bits and the data block into the corresponding parity bit caches; and
   with all intermediate parity bits having been obtained, determining that data in the parity bit caches are the target information bits and the target parity bits.

8. The method of claim 6, wherein the obtaining the target information bits and the target parity bits from the parity bit caches comprises:
   obtaining a preset degree of parallelism;
   obtaining the target information bits in a serial manner according to the degree of parallelism; and
   obtaining the target parity bits from the parity bit caches in a parallel manner according to the degree of parallelism and the target arrangement structure.

9. An electronic device, comprising: a memory, a processor, and a computer program stored in the memory and executable by the processor, wherein the computer program, when executed by the processor, causes the processor to implement a data encoding method, comprising:
   writing information bits into at least two cache blocks, wherein the cache blocks store parity bits corresponding to the information bits, and data of two adjacent bits of data of the parity bits are stored in different cache blocks; and
   performing low density parity check code (LDPC) encoding according to the information bits and the parity bits in the cache blocks.

10. A non-transitory computer-readable storage medium, storing computer-executable instructions configured to cause a computer to implement a data encoding method, comprising:
    writing information bits into at least two cache blocks, wherein the cache blocks store parity bits corresponding to the information bits, and data of two adjacent bits of data of the parity bits are stored in different cache blocks; and
    performing low density parity check code (LDPC) encoding according to the information bits and the parity bits in the cache blocks.

11. The device of claim 9, wherein the at least two cache blocks belong to a same random access memory (RAM).

12. The device of claim 9, before writing information bits into at least two cache blocks, the method further comprises:
    obtaining a preset target arrangement structure; and
    determining parity bit caches in the at least two cache blocks, wherein an arrangement structure formed by all the parity bit caches matches the target arrangement structure.

13. The device of claim 12, after determining parity bit caches in the at least two cache blocks, the method further comprises:
    clearing the parity bit caches.

14. The device of claim 12, wherein the writing information bits into at least two cache blocks comprises:
  obtaining a data block from the information bits;
  determining initial parity bits to be updated based on the data block and determining target cache address information corresponding to the initial parity bits; and
  writing the data block into the parity bit caches according to the target cache address information, wherein data of the data block in the parity bit caches and data of the initial parity bits have a same encoding processing order.

15. The device of claim 14, wherein the performing LDPC encoding according to the information bits and the parity bits in the cache blocks comprises:
  performing updating iterative calculation for the initial parity bits and the data block in the parity bit caches to obtain target information bits and target parity bits, wherein the target information bits and the target parity bits are stored in the parity bit caches; and
  obtaining the target information bits and the target parity bits from the parity bit caches, and performing exclusive or (XOR) calculation on the target parity bits to obtain an LDPC encoding result.

16. The device of claim 15, wherein the number of the data blocks is at least two, and the performing updating iterative calculation for the initial parity bits and the data block in the parity bit caches comprises:
  obtaining the data blocks and the initial parity bits from the parity bit caches;
  performing updating iterative calculation for each data block and the corresponding initial parity bits to obtain intermediate parity bits, and writing the intermediate parity bits and the data block into the corresponding parity bit caches; and
  with all intermediate parity bits having been obtained, determining that data in the parity bit caches are the target information bits and the target parity bits.

17. The device of claim 15, wherein the obtaining the target information bits and the target parity bits from the parity bit caches comprises:
  obtaining a preset degree of parallelism;
  obtaining the target information bits in a serial manner according to the degree of parallelism; and
  obtaining the target parity bits from the parity bit caches in a parallel manner according to the degree of parallelism and the target arrangement structure.

18. The storage medium of claim 10, wherein the at least two cache blocks belong to a same random access memory (RAM).

19. The storage medium of claim 10, before writing information bits into at least two cache blocks, the method further comprises:
  obtaining a preset target arrangement structure; and
  determining parity bit caches in the at least two cache blocks, wherein an arrangement structure formed by all the parity bit caches matches the target arrangement structure.

20. The storage medium of claim 19, after determining parity bit caches in the at least two cache blocks, the method further comprises:
  clearing the parity bit caches.

* * * * *